United States Patent [19]

Iwasaki et al.

[11] Patent Number: 4,686,707
[45] Date of Patent: Aug. 11, 1987

[54] PROGRAM IDENTIFIER SIGNAL RECEIVER

[75] Inventors: Hideki Iwasaki; Tomohisa Yokokawa; Masanori Kurosaki, all of Saitama, Japan

[73] Assignee: Pioneer Electronic Corporation, Tokyo, Japan

[21] Appl. No.: 738,719

[22] Filed: May 29, 1985

[30] Foreign Application Priority Data

May 29, 1984 [JP] Japan .............................. 59-107595

[51] Int. Cl.$^4$ .............................................. H04B 1/16
[52] U.S. Cl. ...................................... 455/200; 455/70; 455/228; 455/355
[58] Field of Search ................. 455/70, 200, 234, 235, 455/228, 355, 68; 340/825.69

[56] References Cited

U.S. PATENT DOCUMENTS

| | | | |
|---|---|---|---|
| 2,065,826 | 12/1936 | Roosenstein et al. | 455/355 |
| 2,617,923 | 11/1952 | Rekart | 455/70 |
| 2,630,525 | 3/1953 | Tomberlin et al. | 455/70 |
| 3,444,469 | 5/1969 | Miyagi | 455/70 |
| 3,639,839 | 2/1972 | Fukata | 455/70 |
| 3,684,965 | 8/1972 | Gautney et al. | 455/70 |
| 3,845,391 | 10/1974 | Crosby | 455/70 |
| 3,906,348 | 9/1975 | Willmott | 348/825.69 |

FOREIGN PATENT DOCUMENTS

| | | | |
|---|---|---|---|
| 2013659 | 10/1971 | Fed. Rep. of Germany | 455/70 |
| 2518101 | 11/1976 | Fed. Rep. of Germany | 455/355 |
| 2266388 | 10/1975 | France | 455/355 |
| 0021711 | 2/1977 | Japan | 455/228 |
| 0072440 | 5/1982 | Japan | 455/70 |
| 0123236 | 7/1983 | Japan | 455/228 |

Primary Examiner—Jin F. Ng
Attorney, Agent, or Firm—Sughrue, Mion, Zinn Macpeak & Seas

[57] ABSTRACT

A multi-bit program identification signal is transmitted in the audible band with a program signal, and a receiver detecting the program identification signal automatically sets a predetermined minimum volume for reproduction of the program information. The volume control circuitry at the receiver can be made responsive to any one of a plurality of different program identification signals.

6 Claims, 5 Drawing Figures

PROGRAM IDENTIFIER SIGNAL RECEIVER

BACKGROUND OF THE INVENTION

1. Field of the Invention

This invention relates to a radio receiver designed to receive program identification signals transmitted simultaneously with specific news information, such as traffic information, weather reports etc.

2. Prior Art

The traffic information system (called the ARI) developed in West Germany uses a low frequency signal, in the AM band, as the 57 Khz band identification signal. This signal is sent continuously while traffic information is being transmitted. As a result, a means for sensing the said low frequency signal must be provided. The output from this means of detection is used as the key for listening to the traffic information.

This method is efficient for the transmission of a single program such as a traffic information broadcast. However, this system has limitations when an attempt is made to broaden it for use in listening to several different programs, such as weather reports, news etc., which involves the use of multiple identification codes.

SUMMARY OF THE INVENTION

The primary purpose of this invention is to overcome the above disadvantages, by transmitting unique identification codes for each of the programs. All the user needs to do is to set the identification code or codes of the program or programs he wants to listen to. This invention also seeks to provide a device for enabling reception of program identification codes being transmitted in the above transmission mode.

Since differing program identification codes can be reproduced and utilized, this device is capable of unique operations described later. This allows the invention to provide a receiver which is "user friendly".

When the selected program is identified, even if the volume setting is low at that time, this device automatically raises the volume, making sure that the listener does not miss important information being broadcast.

BRIEF DESCRIPTION OF THE DRAWINGS

The invention will be more clearly understood from the following description in conjunction with the accompanying drawings, wherein.

DESCRIPTION OF THE PREFERRED EMBODIMENT

As described earlier, the device of the current invention is capable of identifying the program to be received. Before going into the details of the preferred embodiment of this invention, the broadcasting system for which the device of this invention is applicable shall be described.

Figure 2:
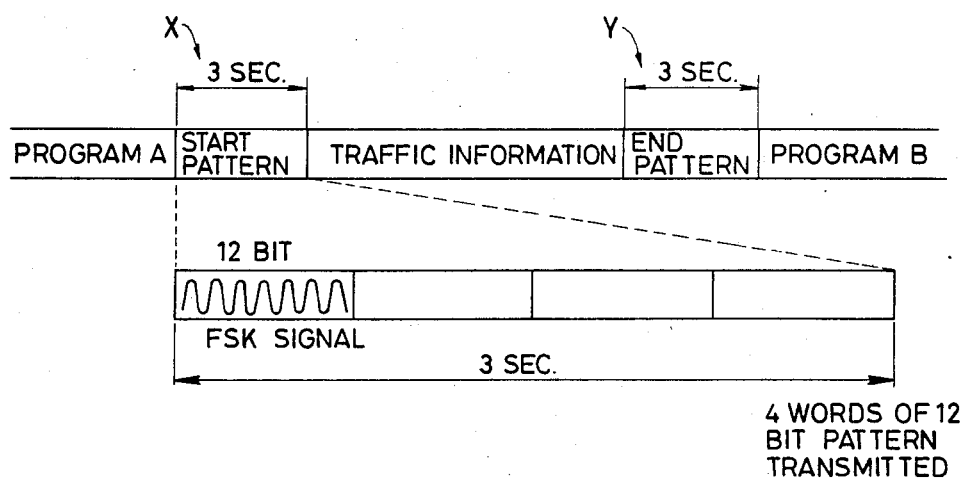
FIG. 2 illustrates the program format of the broadcast system used in the device of the present invention.

FIG. 2 shows an outline of the format of a program to be broadcast. Referring to FIG. 2, as shown by X in the figure, different start patterns, each comprising four 12-bit words, are transmitted for 3 seconds for each different program such as the traffic information program, etc. Each program is then sent following its respective start pattern. Upon completion of the program, an end code of four 12-bit words is transmitted for 3 seconds as shown by Y, and the broadcast then proceeds to Program B. Each of the start and end code patterns occupy, for example, the 24 Hz or the 32 Hz audio band, and they are transmitted as 0, 1 data patterns after frequency shift keying (FSK) modulation. Therefore, the FSK demodulation unit on the receiver side distinguishes between the 24 Hz and 32 Hz signals and outputs the corresponding 12 bit patterns.

Out of the 12 bits in the start code pattern, the type of program can be identified using some of the 12 bits. This allows the device of the present invention to distinguish between a large number of programs using combinations of 0s and 1s. Only one end pattern is needed for normal operation.

Figure 1:
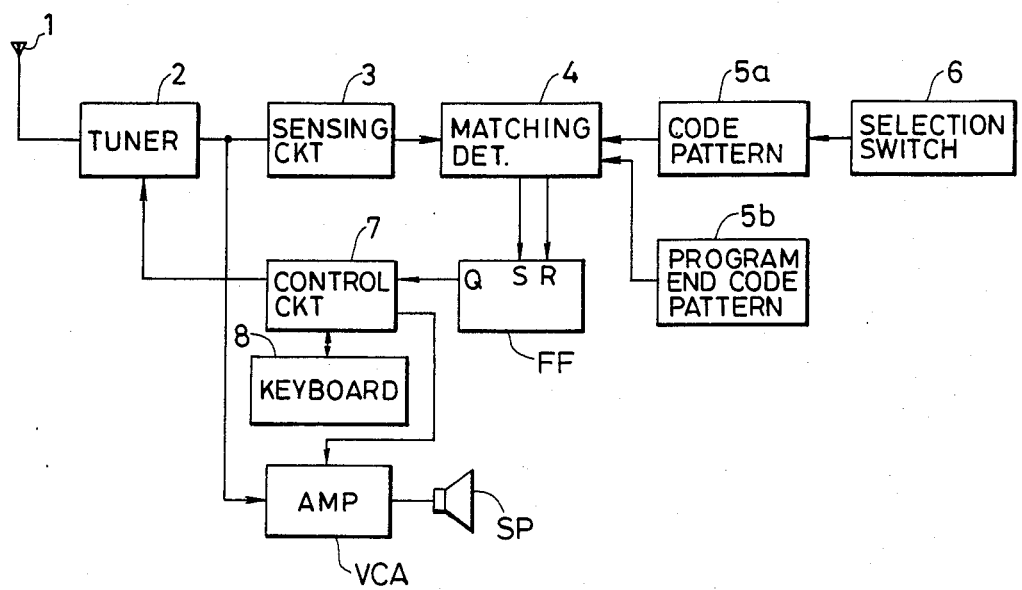
FIG. 1 is a block diagram of the preferred embodiment of the device according to the present invention.

FIG. 1 is a block diagram of the preferred embodiment of this invention. A signal received by antenna 1 is passed to a tuner section 2. The output from the tuner is routed to the voltage control amplifier VCA where the demodulation output is amplified and then applied to the speaker SP to be reproduced as an audio signal. In FIG. 1, 3 is the program identification signal detector circuit connected to the demodulated signal output of the tuner section 2. The output from the detector circuit 3 is applied to the matching detection circuit 4. The output from the program start code pattern transmission circuit 5a and the program end pattern transmission circuit 5b are also applied to the matching detection circuit 4. In addition to the above, a program selection switch 6 is also installed on the above program start code pattern transmission circuit.

The output terminal of the matching detection circuit 4 is connected to RS flip-flop circuit FF. The Q output terminal of the RS flip-flop circuit FF is connected to a control input terminal of the control circuit 7. The control circuit 7 regulates the control voltage to the above described voltage control amplifier VCA in response to the output from the flip-flop circuit FF. This circuit also receives control signals entered from the keyboard and changes the band selection setting on the above tuner section 2.

Figure 3:
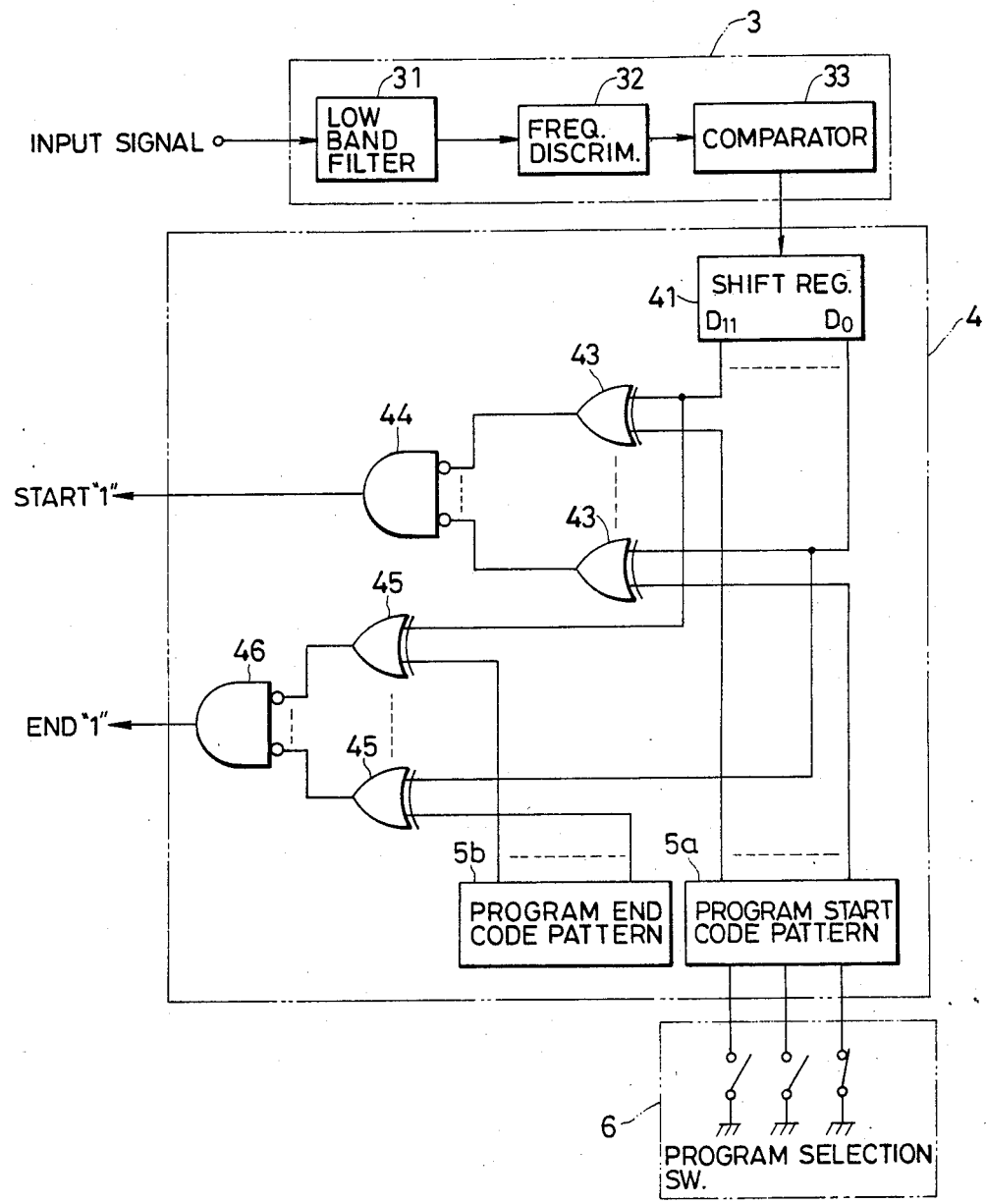
FIG. 3 is a brief schematic diagram illustrating a practical example of the program identifier signal sensing circuit and the matching detection circuit of FIG. 1.

FIG. 3 illustrates examples of the program identifier signal sensing circuit 3, matching output circuit 4, program start code pattern transmission circuit 5a, program end pattern transmission circuit 5b and program selection switch 6 shown in FIG. 2. Referring to FIG. 3, the program identifier sensing circuit 3 includes a low pass filter 31, a frequency differentiation circuit 32 and a comparator 33. The demodulated output from tuner section 2 is passed through the filter 31, where only the low band component is picked up and the FSK signal is output. As described above, this FSK signal is a shift keying signal, such as a 24 KHz or a 32 KHz signal. It is discriminated in the discrimination circuit 32. Finally, a 12 bit digital signal is output as the shift data from comparator 33.

This 12 bit digital signal is applied as a serial signal to the shift register 41. Register 41 converts the said serial signal into a parallel signal and applies it to pins D1 to D11. The shift register 41 output terminals D0 to D11 are each connected to one input terminal of respective exclusive OR circuits 43. The other input terminals of the EX-OR circuits 43 are connected to the 12 output terminals of the program start code pattern transmission circuit 5a. Each of the EX-OR circuits 43 compares respective bits of the shift register 41 and the program start code pattern transmission circuit 5a. The compare outputs from the EX-OR circuits 43 are applied to NOR circuit 44, so that a high level (H) output is obtained from the NOR circuit 44 only when all the bits of shift register 44 match all of the bits of program start code pattern transmission circuit 5a. The comparison can be performed four times, i.e., once for each word in the start position, to ensure accurate detection.

Similarly, one input terminal of each EX-OR is connected to a respective output terminal from shift register 41, while the other input terminals are connected to output terminals of the program end code pattern transmission circuit 5b. Outputs from the EX-OR circuits 45 are applied to the NOR circuit 46. Therefore, when all of the bits of shift register 41 and the program end code pattern transmission circuit 5b match, a level H signal is output by NOR circuit 46.

Program selection switch 6 includes a plurality of switches which can be controlled (ON/OFF) independently, e.g., a plurality of push button switches. When a switch is turned ON, a predefined 12 bit pattern, corresponding to a particular program, is transmitted from the program start code pattern transmission circuit 5a. In this way, the three illustrated switches will allow selection of three programs, or eight programs if the circuit 5a is a memory with the switches forming an address input.

Figure 4:
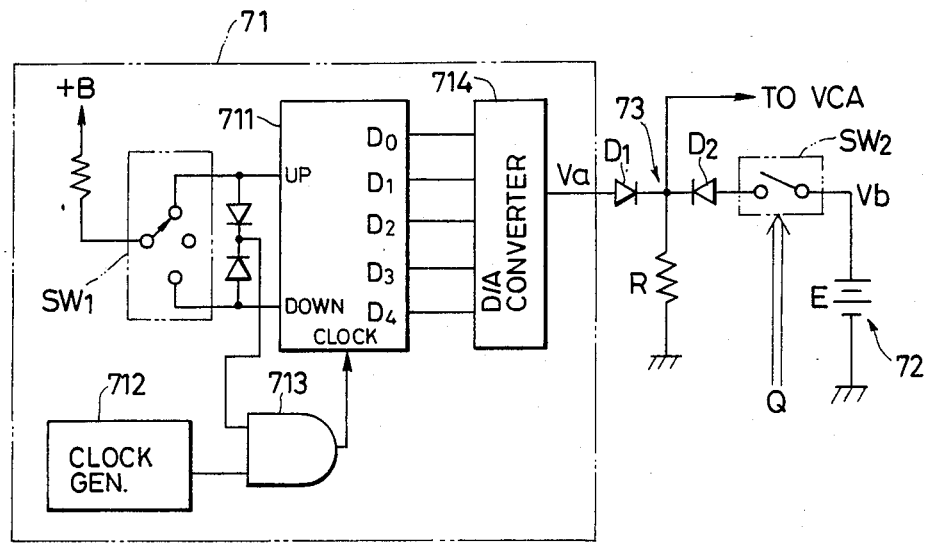
FIG. 4 is a schematic diagram of the control voltage generation circuit of FIG. 1.

FIG. 4 illustrates the control voltage generation circuit 7 shown in FIG. 1. This control voltage generation circuit comprises a variable control voltage generation circuit 71 (which can be operated manually), a fixed voltage generation circuit 72 and an OR output circuit 73, designed to output voltage from either the variable or fixed voltage output circuit, whichever is higher.

The variable control voltage generation circuit 71 comprises an UP/Down counter 711 which has +B applied to its up or down terminals under control of the manual selection switch SW1, and AND circuit 713 which uses the +B input applied to the up or down terminals as one of its inputs and the clock signal from the clock generator 712 as the other input to generate an AND output which is applied to the clock input terminal of the above described UP/DOWN counter 711. A D/A converter 714 converts the binary signals applied to the UP/DOWN counter 711 output terminals D0-D4 into analog signals. The variable DC output Va obtained from the D/A converter 714 is applied to the load resistor R via diode D1.

The fixed control voltage generation circuit 72 is an equalizer battery E obtained, e.g., by resistor segmentation of the +B supply. The output Vb from this circuit is applied to the load resistor R via switch SW2 and diode D2, with the switch SW2 controlled (ON/OFF) by the Q output from RS flip-flop circuit FF.

Therefore, the matching detection circuit 4 sets the flip-flop circuit FF when it a predetermined program identifier signals, and a level H signal is provided from the terminal Q. The level H output turns ON the switch SW2, shown in FIG. 4.

Figure 5:
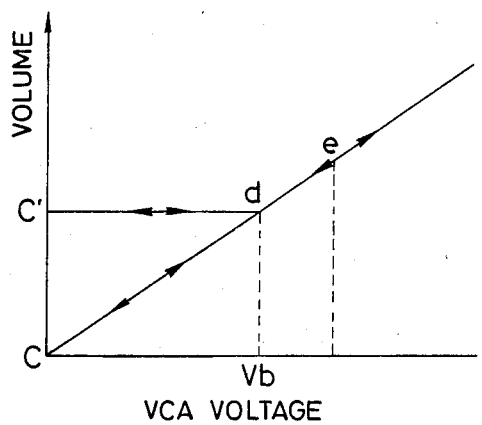
FIG. 5 is a graphic illustration of the relationship between the control voltage and the reproduced volume level.

The above-described UP/DOWN counter 711 regulates the variable DC output Va in response to the UP or DOWN operation of the switch SW1 as shown in FIG. 5 (c to d to e, or e to d to c). When the switch SW2 is turned ON, voltage Va or Vb, whichever is higher, is applied to the voltage control amplifier VCA as the control voltage, in accordance with the above-described operation of the OR circuit 73. As a result, the control voltage will be maintained at least at d, with a corresponding volume of at least c' as shown in FIG. 5. This means that, when an identifier signal of a specific program such as traffic information is sensed, even if the variable DC output voltage is below Vb, that is if reproduction is set to low volume, the output Vb from fixed control voltage generation circuit 72 is applied as the control voltage to the voltage control amplifier VCA. This assures reproduction of the demodulated signal (traffic information, etc.), at a predefined volume at the speaker SP.

When traffic information etc. has been completed and the incoming end code pattern is received, it is detected at the matching detection circuit 4 and the flip-flop circuit FF is reset. Then the switch SW2 is switched OFF to reset the output Q to level L. As a result, the volume of SP is automatically reset to its original level.

Of course, if the original volume level is higher than c', the volume will not rise above the current volume setting when a program identifier signal is received.

Because of the unique design of the device of the current invention, the volume will be raised automatically when the required information is received, even if a user is listening at a lower volume at the time such information is broadcast. This eliminates the possibility that a user may miss hearing important information.

While a particular implementation of the invention has been described above, it should be emphasized that the invention is not limited thereto. For example, the exact type and format of the program identifying signal, or the type of broadcast system in which it is used, could vary without departing from the spirit and scope of the invention as defined in the appended claims. More particularly, while the description above concerns an FM broadcast system, the invention could be used as well in an AM system by changing the modulation scheme of the program identification signal and/or by providing a separate path for the detection of the program identification signal without passing the program identification signal through the tuner section 2.

What is claimed is:

1. A broadcast wave receiver for receiving a program signal, said receiver having means for receiving a broadcast signal containing a program signal portion representing audio information and a program identification signal portion, and means for reproducing said audio information accordance with said program signal portion, said receiver including:

an antenna;
　　tuner means connected to said antenna;
　　volume control means receiving the output from said tuner and responsive to a detection means for controlling the volume of reproduction of said audio information;
　　said detection means receiving an output of said tuner means for detecting a predetermined program identification signal, said detection means comprising:
　　　means for detecting a selected one of a plurality of program identification signals, comprising:
　　　　manually operated selection means for selecting that one of said program identification signals to be detected;

sensing means for sensing said program identification signal portion;

start code pattern generation means for selectively generating one of a plurality of different start code patterns; and comparison means for comparing said sensed program identification signal to the generated start code pattern and for providing an output signal to said volume control means when said compared patterns match.

2. A broadcast wave receiver as claimed in claim 1, wherein said volume control means comprises means for setting a minimum volume of reproduction.

3. A broadcast wave receiver as claimed in claim 1, wherein said reproduction means reproduces said audio information at a volume in accordance with a volume control signal, said receiver including an adjustable volume control for providing a first control signal, and said volume control means including means for generating a predetermined second control signal and means for selecting as said volume control signal the one of said first and second control signals representing the higher volume of reproduction.

4. A broadcast wave receiver as claimed in claim 1, wherein said program identification signal is a multi-bit frequency shift keying (FSK) modulated signal, and wherein said detection means comprises means for detecting a multi-bit FSK program identification signal.

5. A broadcast wave receiver as claimed in claim 1, wherein said detection means further comprises program end code pattern generation means for generating a program end code, wherein said sensing means senses a program end pattern following a received program signal, and said comparison means provides a second signal to said volume control means to release said volume control at the end of said program signal.

6. A broadcast wave receiver as claimed in claim 1, wherein said program identification signal is transmitted in the audible frequency band.

* * * * *